United States Patent [19]
Frissell

[11] 4,229,699
[45] Oct. 21, 1980

[54] MULTIPLE CLOCK SELECTION SYSTEM
[75] Inventor: John M. Frissell, Dracut, Mass.
[73] Assignee: Data General Corporation, Westboro, Mass.
[21] Appl. No.: 908,115
[22] Filed: May 22, 1978
[51] Int. Cl.³ .............................................. H03K 1/17
[52] U.S. Cl. .................................... 328/63; 307/243; 307/269; 328/104
[58] Field of Search ............... 307/219, 241, 243, 269; 328/63, 72, 104

[56] References Cited
U.S. PATENT DOCUMENTS

| 3,329,905 | 7/1967 | Niertil et al. | 307/219 |
| 3,414,736 | 12/1968 | Hagee | 307/219 |
| 3,932,816 | 1/1976 | MacGregor | 307/243 |

Primary Examiner—Stanley D. Miller, Jr.
Assistant Examiner—B. P. Davis
Attorney, Agent, or Firm—Robert F. O'Connell

[57] ABSTRACT

A system for switching among a plurality of input clock signals to produce an output clock signal which avoids the presence of spurious signals during the process of switching from one to another of said plurality of input clock signals. When it is desired to switch from one input clock signal to a new input clock signal, clock output logic is inhibited from supplying any clock output signal for a selected time period, after which the newly selected input clock signal is supplied as the clock output signal. The time period is dependent on the clock pulse rate of the newly selected input clock signal and is sufficiently long to assure that no spurious signals will occur thereafter.

10 Claims, 4 Drawing Figures

MULTIPLE CLOCK SELECTION SYSTEM

INTRODUCTION

This invention relates generally to data processing systems utilizing multiple clock sources and, more particularly, to systems for switching from one selected clock signal to another while avoiding spurious signals which may be generated during the switching process.

BACKGROUND OF THE INVENTION

In many data processing systems more than one clock source may be utilized for providing clock pulse signals at different frequencies, i.e., at different pulse repetition rates. During operation of such systems the system clock signal must sometimes be switched from one clock source to another.

In many such systems the switching process introduces spurious signals at the clock output line, or lines, which supply the clock pulses to various elements of the data processing system, the presence of such spurious signals (often called "glitches") providing an incorrect operation of the system. In order to avoid such a problem, switching techniques in the past have often required relatively sophisticated and complex circuitry for eliminating the spurious signals, the use of such circuitry increasing the overall costs of the clock selection circuitry.

It is desirable, therefore, to achieve such switching in an effective manner so as to avoid such spurious signals and to do so utilizing much simpler and less costly logic circuitry than has been used in the past.

BRIEF SUMMARY OF THE INVENTION

In accordance with the invention, clock selection, or switching, circuitry has been devised for inhibiting the supplying of a clock output signal for a selected time period after one clock signal has been switched out of the system and another clock signal has been switched into the system. Thus, during such time period, no clock signal is supplied to the system. The time period is selected to be sufficiently long that by the end thereof any spurious signals which have occurred during the switching process are no longer present and the newly selected clock signal which has been switched into the system will have the desired precise clock pulse rate required.

DESCRIPTION OF THE INVENTION

The invention can be described in more detail with the help of the accompanyings wherein FIG. 1 shows a block diagram of a clock selection system in accordance with the invention;

Figure 1:
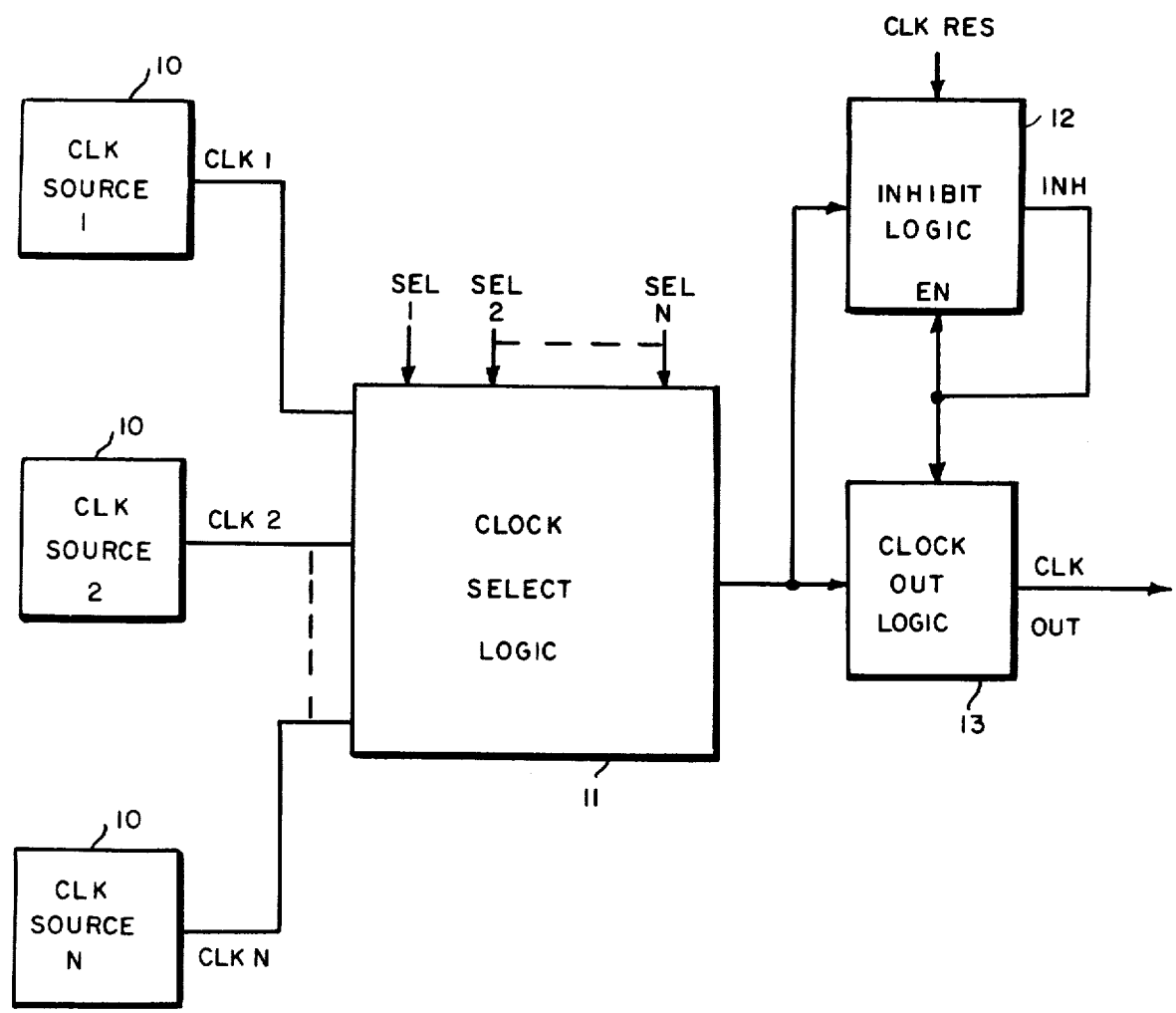

The logic circuitry of FIG. 1, depicted in block diagram form, provides clock selection logic 11, inhibit logic 12, and clock output logic 13, the combination of which is capable of selecting one of a plurality of input clock signals, identified as CLK 1, CLK 2, . . . CLK N signals obtained from clock sources 10, and producing an output clock signal, identified as CLK OUT corresponding thereto. The selection of a particular clock signal is provided for by the clock select logic 10 as controlled by the SEL 1, SEL 2, . . . SEL N signals, for example.

In accordance with such logic the selected clock signal is supplied to clock output logic 13 and to inhibit logic 12. The inhibit logic, however, prevents the selected clock signal from being supplied at the output of logic 13 until all of the spurious signals which might normally be generated during the switching process effectively "die out". At the end of the inhibit time period the newly selected clock signal is present at the output of logic 13 as the CLK OUT signal. The clock switching process is initiated, for example, by the CLK RES signal.

Figure 2:
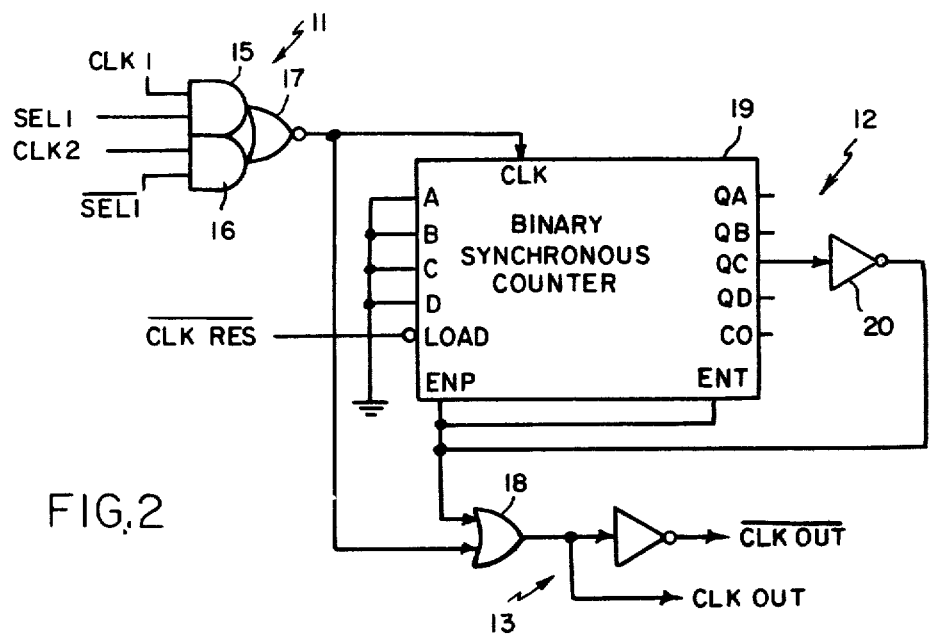
FIG. 2 shows a more detailed logic diagram of a specific embodiment of the clock selection system of FIG. 1.

A specific embodiment of the invention shown in FIG. 1 is depicted in FIG. 2, wherein, for simplicity, a data processing system is shown as requiring the use of one of two clock signals. A first clock signal, identified as CLK 1, and a second clock signal, identified as CLK 2, are supplied to AND gates 15 and 16, respectively. Each of said AND gates has applied to it a corresponding select signal identified as SEL 1 and $\overline{\text{SEL 1}}$, respectively. When SEL 1 is asserted an output is obtained from AND gate 15 as first clock signal CLK 1 and when $\overline{\text{SEL 1}}$ is asserted the CLK 2 signal is obtained at the output of AND gate 16. Each of the clock signals can be supplied from an appropriate clock source (not shown) of a type well known to those in the art. The outputs of AND gates 15 and 16 are supplied to an OR gate 17 which supplies at its output whichever one of the clock signals has been so selected. The selected clock signal is supplied to an output OR gate 18 and to the CLK input of a binary synchronous counter 19.

The counter 19 may be, for example, of the type manufactured and sold under the designation 74LS163 by Texas Instruments Company, Dallas, Tex. In such counter circuit, input pins A, B, C and D are grounded and an output is obtained from the "QC" output counter stage, as shown. The output therefrom is supplied to an inverting pulse amplifier 20 and thence to an input of OR gate 18. During the counting operation the output of inverter 20 provides an inhibit signal which prevents the supplying of a clock signal at the output of gate 18, i.e., during the first four stages, or counts, of the clock signal at the CLK input of counter 19. The CLK OUT signal remains high during such time period. At the fourth stage count (the QC stage), the output of inverter 20 goes now and the counter 19 is disabled. At such time OR gate 18 then permits the selected input clock signal to be supplied as the CLK OUT signal.

Figure 3:
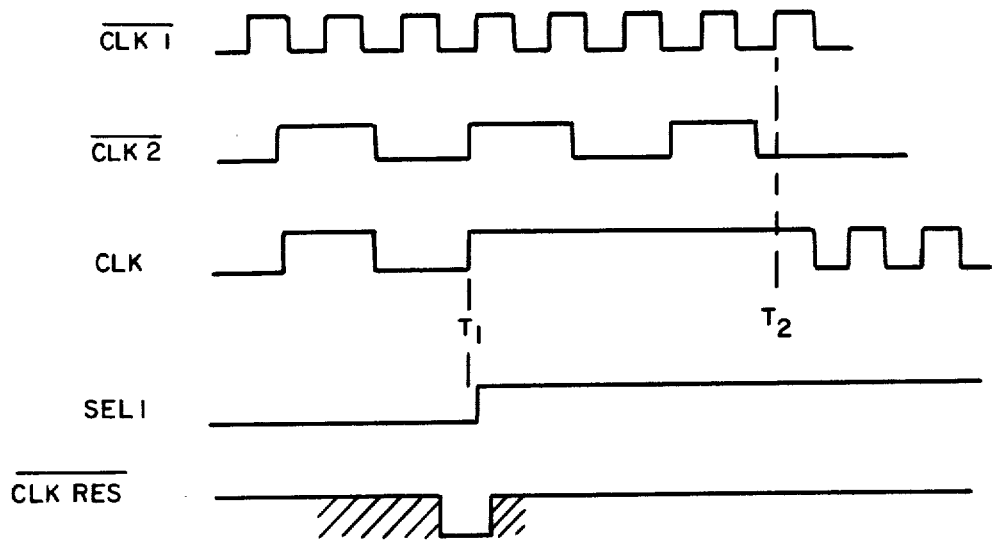
FIG. 3 shows a timing diagram of pertinent signals present in the operation of the specific embodiment of FIG. 2.

The operation of the circuitry of FIG. 2 can be better understood with the help of the timing diagram of FIG. 3. As can be seen in the latter figure, a first clock signal identified as CLK 1 has a higher clock rate than a second clock signal identified as CLK 2. It is assumed that the CLK 2 signal has been previously selected as the CLK OUT signal and that it is now desired to switch the latter signal from the CLK 2 to the CLK 1 signal at time $T_1$. Clock switching is initiated by the CLK RES signal. This signal goes low before the rising edge of the clock at $T_1$. This causes the counter to be loaded to zero, resulting in QC going high, enabling the counter to movement and causing the CLK OUT signal to be inhibited. A short time after $T_1$ the SEL 1 signal is asserted (the previously asserted $\overline{\text{SEL 1}}$ signal becomes non-asserted) so that the CLK 1 signal is supplied from clock selection logic 11 to OR gate 16 instead of CLK 2.

At the same time CLK 1 is supplied to the CLK input of counter 19 which begins its count in accordance with the frequency of CLK 1. An inhibit signal is supplied at the output of inverter 20, as described above, such signal being high and inhibiting the supplying of any clock signals from OR gate 16, the output of OR gate 16 thereupon remaining high for a selected time period so long as the counter is counting. Such time period depends on which count stage output has been selected at counter 19 to supply the inhibit signal. As shown in the specific embodiment of FIG. 2, the fourth counting stage (QC) has been selected to supply the inhibit signal so that the output of OR gate 16 remains high for four cycles of the CLK 1 input signal to the counter. Any spurious signals which may be present during such time period are thereby prevented from being placed on the CLK OUT line.

At the end of the fourth count stage (at $T_2$) the output at inverter 20 goes low and disables the counter operation (at the ENP and ENT inputs) so that no further counting occurs. Since the inhibit signal at gate 18 is low the clock signal supplied to the other input thereof is supplied as CLK OUT at the output thereof at time $T_2$, as shown.

The system of FIG. 2 in effect provides a "dead" space at the time switching occurs from one clock to another. Such inhibit time period prevents the placing of any spurious signals on the CLK OUT line for a selected number of cycles of the newly selected clock signal.

Figure 4:
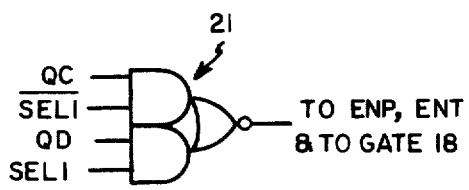
FIG. 4 shows logic which can be used in an alternative embodiment of FIG. 2.

Although the specific embodiment shown in FIG. 2 is described in connection with the selection of one of two input clock signals, it would be clear to those in the art that the input logic can be arranged to select one out of more than two input clock signals as discussed above in connection with the block diagram of FIG. 1. Further, while the counter is arranged in the specific embodiment of FIG. 2 to inhibit the supplying of a CLK OUT signal for a selected number of cycles of the input clock signal thereto, the counting delay can also be made a function of the clock selected (SEL 1 or $\overline{\text{SEL 1}}$ in this case). For example, if inverter 20 is replaced by the gating logic 21 in FIG. 4, the clock will remain high for four cycles after selecting CLK 2 but eight cycles after selecting CLK 1. Further, while the restart signal $\overline{\text{CLK RES}}$ is shown as supplied to clear the load terminal of the counter to zero, such signal can also be applied to the CLR terminal thereof as would be well known to those in the art.

Hence, the invention is not to be construed as limited to the specific embodiments shown and described above as other modifications within the spirit and scope of the invention will occur to those in the art.

What is claimed is:

1. Clock signal selection circuitry comprising
   means for providing at least two input clock signals, each having a different clock rate;
   means for selecting one of said at least two input clock signals;
   means responsive to said selected input clock signal for supplying an output clock signal corresponding to said selected input clock signal;
   single delay means responsive to said selected input clock signal for inhibiting the supplying of said output clock signal for a selected time period after a different one of said at least two input clock signals has been selected by said selecting means;
   said output clock signal supplying means being responsive to a newly selected input clock signal for supplying, after said selected time period, an output clock signal corresponding to said newly selected input clock signal.

2. Clock signal selection circuitry in accordance with claim 1 wherein said single delay means includes counter means responsive to said newly selected input clock signal for providing a counter output signal which prevents the supplying of an output clock signal during said selected time period.

3. Clock signal selection circuitry in accordance with claims 1 or 2 wherein said selected time period is dependent upon the clock rate of the newly selected input clock signal.

4. Clock signal selection circuitry in accordance with claims 1 or 2 wherein said selected time period is equal to a selected number of cycles of said newly selected input clock signal.

5. Clock signal selection circuitry in accordance with claim 4 wherein said selected number of cycles is four.

6. Clock signal selection circuitry in accordance with claim 1 wherein said selected time period is a fixed multiple of the newly selected clock.

7. Clock signal selection circuitry in accordance with claims 1, 2, 5 or 6 wherein said input clock signal providing means provides two input clock signals, said output clock signal supplying means supplying one of said two input clock signals.

8. Clock signal selection circuitry in accordance with claim 3 wherein said selected time period is equal to a selected number of cycles of said newly selected input clock signal.

9. Clock signal selection circuitry in accordance with claim 3 wherein said input clock signal providing means provides two input clock signals, said output clock signal supplying means supplying one of said two input clock signals.

10. Clock signal selection circuitry in accordance with claim 4 wherein said input clock signal providing means provides two input clock signals, said output clock signal supplying means supplying one of said two input clock signals.

* * * * *